United States Patent
Popov et al.

(10) Patent No.: US 11,693,364 B2
(45) Date of Patent: Jul. 4, 2023

(54) HOLOGRAPHIC DISPLAY AND HOLOGRAPHIC IMAGE FORMING METHOD

(71) Applicant: Samsung Electronics Co., Ltd., Suwon-si (KR)

(72) Inventors: Mikhail Vyacheslavovich Popov, Moscow (RU); Stanislav Aleksandrovich Shtykov, Moscow (RU); Sergey Aleksandrovich Shestak, Seoul (KR); Seondeok Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 373 days.

(21) Appl. No.: 16/765,993

(22) PCT Filed: Nov. 28, 2018

(86) PCT No.: PCT/KR2018/014789
§ 371 (c)(1),
(2) Date: May 21, 2020

(87) PCT Pub. No.: WO2019/107907
PCT Pub. Date: Jun. 6, 2019

(65) Prior Publication Data
US 2020/0363772 A1    Nov. 19, 2020

(30) Foreign Application Priority Data
Nov. 30, 2017   (RU) .......................... RU2017141816

(51) Int. Cl.
*G03H 1/22*     (2006.01)
*G02F 1/1333*   (2006.01)

(52) U.S. Cl.
CPC ..... *G03H 1/2294* (2013.01); *G02F 1/133362* (2013.01); *G03H 1/2205* (2013.01);
(Continued)

(58) Field of Classification Search
CPC .............. G03H 1/2294; G03H 1/2205; G03H 2223/23; G03H 2225/22; G03H 2225/25;
(Continued)

(56) References Cited

U.S. PATENT DOCUMENTS

| | | | |
|---|---|---|---|
| 6,437,919 B1 | 8/2002 | Brown et al. | |
| 6,665,108 B2 | 12/2003 | Brown et al. | |

(Continued)

FOREIGN PATENT DOCUMENTS

| | | |
|---|---|---|
| CN | 101842752 A | 9/2010 |
| CN | 102967999 A | 3/2013 |

(Continued)

OTHER PUBLICATIONS

Chinese Office Action dated Apr. 2, 2021, issued in Chinese Application No. 201880076389.4.
(Continued)

*Primary Examiner* — Oschta I Montoya
(74) *Attorney, Agent, or Firm* — Jefferson IP Law, LLP

(57) ABSTRACT

A holographic display and a method, performed by the holographic display, of forming a holographic image are disclosed. The holographic display includes an electrically addressable spatial light modulator (EASLM); a diffractive optical element (DOE) mask array arranged on the EASLM; and a controller configured to operate the holographic display to form a hologram image, wherein the controller is further configured to address the EASLM to backlight the DOE mask array required to form a set of hologram image voxels by turning on a corresponding EASLM pixel.

13 Claims, 12 Drawing Sheets

(52) U.S. Cl.
CPC ...... *G02F 2203/12* (2013.01); *G02F 2203/50* (2013.01); *G03H 2223/23* (2013.01); *G03H 2225/22* (2013.01); *G03H 2225/25* (2013.01); *G03H 2225/32* (2013.01); *G03H 2225/60* (2013.01)

(58) Field of Classification Search
CPC ........... G03H 2225/32; G03H 2225/60; G03H 1/2286; G03H 1/0808; G03H 1/2202; G03H 1/30; G03H 2001/0212; G03H 2001/0216; G03H 2001/0224; G03H 2001/0825; G03H 2001/221; G03H 2001/2223; G03H 2001/261; G03H 2001/264; G03H 2001/306; G03H 2210/452; G03H 2222/34; G03H 2223/12; G03H 2223/13; G03H 2223/14; G03H 2223/17; G03H 2225/12; G03H 2225/23; G03H 2225/55; G03H 1/268; G03H 2210/30; G03H 1/02; G02F 1/133362; G02F 2203/12; G02F 2203/50; G02F 1/133562; G02F 1/133601; G02F 1/133504; G02F 1/133526; G02F 1/1336; H01L 27/14625; H01L 25/167; H01L 27/3225

See application file for complete search history.

(56) References Cited

U.S. PATENT DOCUMENTS

| | | | |
|---|---|---|---|
| 6,753,990 B1 | 6/2004 | Payne et al. |
| 6,760,135 B1 | 7/2004 | Payne et al. |
| 6,927,748 B2 | 8/2005 | Hughes et al. |
| 7,092,046 B2 | 8/2006 | Feoktistov et al. |
| 7,218,435 B2 | 5/2007 | Slinger |
| 7,317,564 B2 | 1/2008 | Payne |
| 7,342,705 B2 | 3/2008 | Chui et al. |
| 7,379,219 B2 | 5/2008 | Payne |
| 7,414,769 B2 | 8/2008 | Slinger |
| 7,567,274 B2 | 7/2009 | Ekpar |
| 7,602,539 B2 | 10/2009 | Payne |
| 7,787,064 B2 | 8/2010 | Kwon et al. |
| 7,872,793 B2 | 1/2011 | Hughes et al. |
| 7,973,989 B2 | 7/2011 | Peyghambarian et al. |
| 8,085,452 B2 | 12/2011 | Stanley |
| 8,154,781 B2 | 4/2012 | Kroll et al. |
| RE43,608 E | 8/2012 | Hughes et al. |
| RE43,642 E | 9/2012 | Feoktistov et al. |
| 8,306,747 B1 | 11/2012 | Gagarin et al. |
| 8,325,401 B2 | 12/2012 | Schwerdtner |
| 8,368,727 B2 | 2/2013 | Smith et al. |
| 8,400,695 B2 | 3/2013 | Kroll et al. |
| 8,416,276 B2 | 4/2013 | Kroll et al. |
| 8,416,479 B2 | 4/2013 | Kroll et al. |
| 8,432,436 B2 | 4/2013 | Debevec et al. |
| 8,564,865 B2 | 10/2013 | Klug et al. |
| 8,612,024 B2 | 12/2013 | Stone et al. |
| 8,746,889 B2 | 6/2014 | Leong et al. |
| 8,823,641 B2 | 9/2014 | Kuhlman et al. |
| 8,836,750 B2 | 9/2014 | Liu et al. |
| 8,854,724 B2 | 10/2014 | El-Ghoroury et al. |
| 8,878,759 B2 | 11/2014 | Crossland et al. |
| 8,890,932 B2 | 11/2014 | Fan et al. |
| 8,982,438 B2 | 3/2015 | Choi et al. |
| 9,035,970 B2 | 5/2015 | Lamb et al. |
| 9,105,210 B2 | 8/2015 | Lamb et al. |
| 9,182,605 B2 | 11/2015 | Goulanian |
| 9,224,241 B2 | 12/2015 | Son |
| 9,288,470 B2 | 3/2016 | Yang et al. |
| 9,304,387 B2 | 4/2016 | Park et al. |
| 9,354,604 B2 | 5/2016 | Lee et al. |
| 9,383,587 B2 | 7/2016 | Balogh |
| 9,406,166 B2 | 8/2016 | Futterer |
| 9,501,036 B2 | 11/2016 | Kang et al. |
| 9,606,362 B2 | 3/2017 | Passmore et al. |
| 2004/0212550 A1 | 10/2004 | He |
| 2004/0246547 A1 | 12/2004 | Payne |
| 2005/0018261 A1 | 1/2005 | Langhans et al. |
| 2006/0050374 A1 | 3/2006 | Slinger |
| 2006/0098093 A1 | 5/2006 | Hahn et al. |
| 2006/0192869 A1 | 8/2006 | Yoshino et al. |
| 2007/0188858 A1 | 8/2007 | Slinger |
| 2007/0296920 A1 | 12/2007 | Mezouari et al. |
| 2010/0046049 A1 | 2/2010 | Kroll et al. |
| 2010/0277566 A1 | 11/2010 | Cable et al. |
| 2011/0002020 A1 | 1/2011 | Khan |
| 2011/0057932 A1 | 3/2011 | Missbach et al. |
| 2011/0096145 A1 | 4/2011 | Schwerdtner |
| 2012/0019883 A1 | 1/2012 | Chae et al. |
| 2012/0086994 A1* | 4/2012 | Choi .................... G03H 1/2294 359/9 |
| 2012/0120059 A1 | 5/2012 | Bratkovski et al. |
| 2012/0299808 A1 | 11/2012 | Lee et al. |
| 2013/0073388 A1 | 3/2013 | Heath |
| 2013/0170767 A1 | 7/2013 | Choudhury et al. |
| 2013/0242262 A1 | 9/2013 | Lewis |
| 2013/0268357 A1 | 10/2013 | Heath |
| 2014/0055692 A1 | 2/2014 | Kroll et al. |
| 2014/0065520 A1* | 3/2014 | Tsang ....................... G03H 1/02 359/9 |
| 2014/0077727 A1 | 3/2014 | Kennedy |
| 2014/0160543 A1 | 6/2014 | Putilin et al. |
| 2014/0258348 A1 | 9/2014 | Hafeez |
| 2014/0358002 A1 | 12/2014 | Daoura |
| 2014/0375763 A1 | 12/2014 | Lee et al. |
| 2015/0036199 A1 | 2/2015 | Leister et al. |
| 2015/0102997 A1 | 4/2015 | Yun et al. |
| 2016/0005106 A1 | 1/2016 | Giraldez et al. |
| 2016/0011565 A1 | 1/2016 | Sung et al. |
| 2016/0109953 A1 | 4/2016 | Desh |
| 2016/0132021 A1 | 5/2016 | Zschau |
| 2016/0165205 A1 | 6/2016 | Liu et al. |
| 2016/0170372 A1 | 6/2016 | Smithwick |
| 2016/0239942 A1 | 8/2016 | Usman |
| 2016/0242623 A1 | 8/2016 | Pasini et al. |
| 2016/0306469 A1 | 10/2016 | Kennedy |
| 2016/0313556 A1 | 10/2016 | Futterer |
| 2016/0320602 A1 | 11/2016 | Kazemzadeh et al. |
| 2017/0075113 A1 | 3/2017 | Wu et al. |
| 2017/0102545 A1 | 4/2017 | Hua et al. |
| 2017/0103584 A1 | 4/2017 | Vats |
| 2017/0124770 A1 | 5/2017 | Vats |
| 2017/0256033 A1 | 9/2017 | Tuzel et al. |
| 2018/0217554 A1 | 8/2018 | Kroll et al. |
| 2018/0338082 A1 | 11/2018 | Baqai et al. |
| 2019/0086682 A1* | 3/2019 | Miller .................. G02B 5/1866 |

FOREIGN PATENT DOCUMENTS

| | | |
|---|---|---|
| DE | 10 2006 025 096 B4 | 3/2012 |
| EP | 0 034 984 A2 | 9/1981 |
| EP | 3 992 163 B1 | 4/2002 |
| EP | 1 023 631 B1 | 11/2004 |
| EP | 1 486 834 A1 | 12/2004 |
| EP | 1 546 817 A2 | 6/2005 |
| EP | 1 379 913 B1 | 7/2005 |
| EP | 1 183 557 B1 | 7/2006 |
| EP | 1 800 192 B1 | 8/2009 |
| EP | 2 084 583 A1 | 8/2009 |
| EP | 2 084 584 A1 | 8/2009 |
| EP | 2 024 793 B1 | 12/2009 |
| EP | 1 421 416 B1 | 1/2010 |
| EP | 2 160 655 B1 | 3/2011 |
| EP | 2 290 473 A2 | 3/2011 |
| EP | 2 372 469 A1 | 10/2011 |
| EP | 1 993 663 B1 | 4/2012 |
| EP | 2 667 620 A2 | 11/2013 |
| EP | 2 784 599 A1 | 10/2014 |
| EP | 2 084 582 B1 | 1/2016 |
| EP | 2 978 217 A1 | 1/2016 |
| EP | 3 029 935 A1 | 6/2016 |
| EP | 2 587 817 B1 | 8/2016 |

(56) References Cited

FOREIGN PATENT DOCUMENTS

| | | |
|---|---|---|
| GB | 2 350 962 A | 12/2000 |
| GB | 2 379 351 A | 3/2003 |
| GB | 2452360 B | 4/2010 |
| JP | 11-231762 A | 8/1999 |
| KR | 10-2012-0010554 A | 2/2012 |
| KR | 10-2012-0037209 A | 4/2012 |
| KR | 10-2012-0123221 A | 11/2012 |
| RU | 2006 110 479 A | 10/2007 |
| WO | 99/000993 A1 | 1/1999 |
| WO | 99/019767 A1 | 4/1999 |
| WO | 00/075698 A1 | 12/2000 |
| WO | 2004/031841 A2 | 4/2004 |
| WO | 2007/132230 A1 | 11/2007 |
| WO | 2008/049906 A1 | 5/2008 |
| WO | 2008/049914 A1 | 5/2008 |
| WO | 2009/109785 A2 | 9/2009 |
| WO | 2017/017465 A1 | 2/2017 |

OTHER PUBLICATIONS

Extended European Search Report dated Aug. 19, 2020, issued in European Application No. 18884313.0.
T. Vu et al., Fast and Efficient Image Quality Enhancement via Desubpixel Convolutional Neural Networks, KAIST, 2018.
Y. S. Chen et al., Deep Photo Enhancer: Unpaired Learning for Image Enhancement From Photographs With GANs, National Taiwan University, 2018.
A. Ignatov et al., DSLR-Quality Photos on Mobile Devices with Deep Convolutional Networks, ETH Zurich, Switzerland, 2017.
B. Lim et al., Enhanced Deep Residual Networks for Single Image Super-Resolution, Seoul National University Winner of NTIRE'2017.
J. Yu et al. Wide Activation for Efficient and Accurate Image Super-Resolution, Adobe Research Winner of NTIRE'2018.
International Search Report dated Mar. 14, 2019, issued in International Application No. PCT/KR2018/014789.
Russian Office Action dated Sep. 25, 2018, issued in Russian Application No. 2017141816/28(072363).
Russian Decision on Grant dated Mar. 7, 2019, issued in Russian Application No. 2017141816/28(072363).
European Office Action dated Jan. 10, 2023, issued in European Patent Application No. 18 884 313.0.

\* cited by examiner

HOLOGRAPHIC DISPLAY AND HOLOGRAPHIC IMAGE FORMING METHOD

TECHNICAL FIELD

The disclosure relates to the forming of holographic images, and more particularly, to a holographic display and a method, performed by a holographic display, of forming a holographic image.

BACKGROUND ART

The forming of three-dimensional (3D) hologram images (holograms) has great potential in many fields of applications, such as telecommunications, medicine, entertainment, military equipment, or the like. However, there are many problems with the large-area implementation using the technique.

Holographic displays that are currently available have large sizes due to optical systems of high quality required for the reproduction of digital holograms displayed on an electrically addressable spatial light modulator (EASLM). This increases the size of holographic images and makes the holographic images almost impossible to be integrated into a wearable smart device (a watch, a phone, a tablet, or the like).

Current holographic displays do not provide sufficient density of small pixels (<1 μm) to ensure a sufficiently wide field of view of holograms displayed on effective coherent and incoherent spatial light modulators (SLM) (for example, a laser backlight and liquid crystal display (LCD), a digital micro-mirror device (DMD), a liquid crystal on silicon (LCoS) organic light-emitting diode (OLED) display (organic light-emitting diode, organic LED), μ-light-emitting diode (μ-LED), or the like.

In addition, when currently widely-used incoherent SLMs (based on smartphones, smart watches, TV sets, or the like) are used to play a hologram having good 3D object depth, optically-addressable spatial light modulator (OASLM) technology is used to convert an incoherent light distribution into a phase distribution (a phase hologram) and then reconstruct the phase distribution into a coherent light source.

Due to the high resolution needed to obtain a required field of view, a digital hologram operation requires a very high operational load on the processor, as well as many resources (power, time, storage capacity, memory speed, or the like), and the larger the hologram image, resolution and field of view, the larger the operational load.

In currently available large and medium (at least 1 inch) size display devices based on LCD technology according to the related art, the pixel size is generally 40 μm to 300 μm. Special coherent sources (lasers) are needed for backlighting in such displays. Such solutions are rarely applicable to digital holography due to its low resolution and narrow field of view, and the high operational load required for hologram operations (resulting in a decrease in an independent operation time and a decrease in a battery life of an independent device), and coherent backlights are required to be used for bandwidth and hologram recording and reproduction.

The pixel size in currently available micro-displays (less than 1 inch) is generally 3 μm to 40 μm. To reconstruct holograms in these displays, a special coherent source (laser or LED with fiber output) is required. Unlike large and medium-sized displays, these displays lack expandability. The micro-displays are generally based on LCD, LCoS, or DMD technology and are suitably applied to digital holography due to small screen size, insufficient resolution, high operational load required for hologram operations (resulting in shorter autonomous operation time and shorter battery life of an independent device), larger storage capacity and wider bandwidth required, and the need to use coherent backlights for hologram recording and playback.

The main problem with currently available displays is a small field of view (FoV). The viewing angle is proportional to $2 \cdot \arcsin(\lambda/2)$, wherein $\lambda$ is a wavelength of light, and p is the SLM pixel size. In the case of a current display in which the pixel size is 3 μm to 250 μm, the viewing angle is about $5° \pm 0.06°$. To provide a 30° of viewing angle, a pixel size of about 1 μm or less is required, which is not available for the consumer at the current technology level. To implement a holographic display device with a wide viewing angle, the pixel size should be reduced several times, and an amount of data to be processed, stored, and transmitted should be increased several times.

In addition, holographic displays may generally operate in a 3D mode and may not be switched to a two-dimensional (2D) mode.

The small holographic display disclosed in U.S. Pat. No. 8,400,695 B2 includes an OLED array (OLED micro-display) recording digital holograms on an OASLM, wherein the OLED micro-display and the OASLM form adjacent layers. A phase hologram is encoded on the OASLM according to light intensity modulation on an OLED micro-display, and then the hologram is reconstructed when the OASLM is illuminated with a backlight. Accordingly, the OASLM is controlled by the OLED array. Disadvantages of the display are the massive amount of computer-generated hologram (CGH) data needed to display a hologram, as well as its complex design. In addition, devices in the related art may not switch between 2D and 3D modes.

Another device in the related art is disclosed in U.S. Pat. No. 8,982,438 B2. The device includes a recording light source emitting a recording beam, an EASLM configured to sequentially modulate the recording beam emitted from the recording light source according to hologram information corresponding to a 3D image spatially divided into a plurality of portions, an OASLM configured to form a hologram by using the modulated recording beam to switch each of the plurality of divided portions of the 3D image and an image corresponding to a corresponding portion, a scanning optical unit configured to reduce and reproduce a hologram formed by the recording beam sequentially modulated by the EASLM, and to transmit the hologram to an area of the OASLM corresponding to the portion, and a reproducing light source configured to illuminate a surface of the OASLM. The disadvantage of the device is the need for a scanning/projection system that increases the device size (thickness). In addition, the device is incapable of 2D/3D mode switching and requires a large amount of CGH data to display a hologram.

DESCRIPTION OF EMBODIMENTS

Technical Problem

An example embodiment provides a compact holographic display.

An example embodiment provides a method, performed by a holographic display, of forming a holographic image.

Solution To Problem

According to an embodiment, a holographic display may include
an electrically addressable spatial light modulator (EASLM);
a diffractive optical element (DOE) mask array arranged on the EASLM; and
a controller configured to operate the holographic display to form a hologram image,
wherein the controller is further configured to address the EASLM to backlight the DOE mask array required to form a set of hologram image voxels by turning on a corresponding EASLM pixel.

The EASLM may be a non-coherent EASLM.

The holographic display may further include an optically addressable spatial light modulator (OASLM) and a backlight unit, and the EASLM, the DOE mask array, and the OASLM may be integrated into a single unit.

The OASLM may include a photosensitive layer and a liquid crystal layer, and the controller may be further configured to operate the OASLM and the backlight unit such that a light intensity distribution formed after the DOE mask array may form a charge distribution in the photosensitive layer of the OASLM and induce phase modulation in the liquid layer of the OASLM to form a phase hologram.

The backlight unit may be configured to form a holographic image by backlighting the phase hologram formed on the liquid crystal layer of the OASLM.

The EASLM may be a coherent EASLM.

The DOE mask array may include multiple arrays of DOE masks stacked in a plurality of layers.

The holographic display may further include an adaptive multi-lens array, and the controller may be further configured to operate the adaptive multi-lens array.

The holographic display may be configured to switch between three-dimensional (3D) and two-dimensional (2D) modes.

The holographic display may be further configured to form a color hologram.

The holographic display may further include a field optical system and/or filter capable of spectral light filtering and spatial and/or angular light filtering of the hologram image voxels.

The DOE mask array may be precomputed and manufactured to have a permanent structure and provide certain features.

The DOE mask array may be addressable, and the controller may be further configured to address the DOE mask array.

The DOE mask array may include a sub-lens, a positive lens, or a transmissive lens.

According to an embodiment, a method, performed by a holographic display, of forming a holographic image may include
receiving holographic image data input by a controller;
generating a control signal to illuminate, with a backlight, a DOE mask which must form a set of holographic image voxels based on the input data by turning on/off a corresponding EASLM pixel; and
forming of a holographic image by the EASLM and the DOE mask array according to a control signal of the controller.

Advantageous Effects of Disclosure

According to an example embodiment, a compact holographic display is provided. For example, according to an example embodiment, a holographic display capable of modulating the scale, which has a pixel size of 1 μm or less and up to half the wavelength of read light, may be provided. Coherent and non-coherent light sources may be used in backlighting. An example embodiment may be based on many displays such as organic light-emitting diode (OLED) display, μ-light-emitting diode (μ-LED) display, liquid crystal on silicon (LCoS), liquid crystal display (LCD), digital micro-mirror device (DMD), or the like. An exemplary holographic display may have a high resolution and a wide field of view and may reduce a computational load required to compute and process a reproduced hologram. The holographic display may reduce a storage capacity and a bandwidth required for digital hologram data transmission and may increase the autonomous operation time of an independent operation and battery life compared to holographic display technology in the related art.

MODE OF DISCLOSURE

Example embodiments are not limited to those described in the disclosure and will be apparent to those of ordinary skilled in the art based on information provided in the skilled in the art and the technical field without departing from the spirit and scope of the disclosure. Elements referred to in the singular do not exclude a plural number unless otherwise specified.

Figure 1:
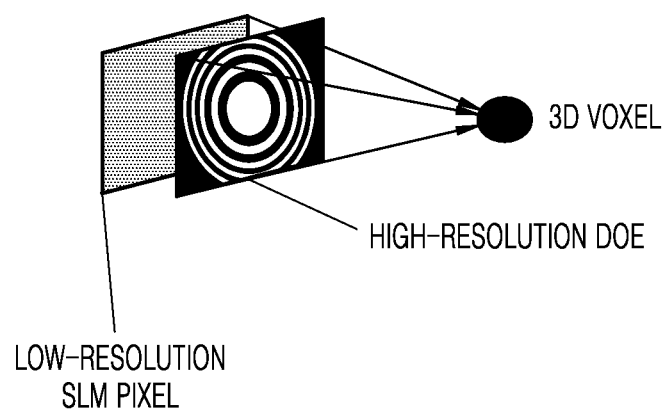
FIG. 1 illustrates a principle of forming a three-dimensional (3D) voxel according to an example embodiment.

FIG. 1 illustrates a principle of forming a three-dimensional (3D) voxel according to an example embodiment.

Each low-resolution spatial light modulators (SLM) pixel (display pixel) operates with a corresponding high-resolution diffractive optical element (DOE) mask (generally an area having DOE) arranged on the SLM pixel (see FIG. 1) to produce a single hologram voxel. When the SLM pixel is turned on, light from the SLM pixel illuminates the corresponding DOE mask to form a hologram voxel at a given distance.

Figure 2:
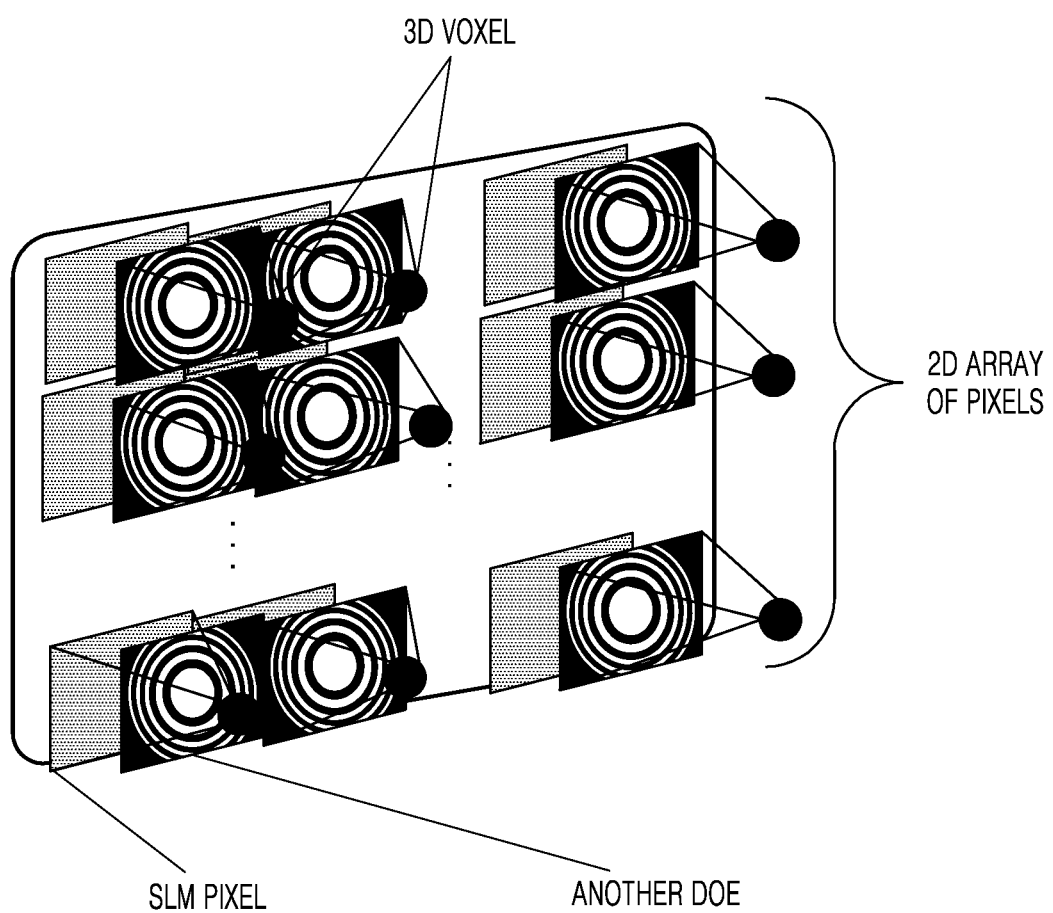
FIG. 2 illustrates a principle of forming a 3D voxel set at different distances by diffractive optical element (DOE) mask arrays each having different characteristics, according to an example embodiment.

FIG. 2 illustrates a principle of forming a set of 3D voxels at different distances by a DOE mask array each having different characteristics, according to an example embodiment.

When a high-resolution DOE mask array arranged on a SLM is used, the field of view (FoV) is increased and a set of 3D voxels (an entire hologram) may be reconstructed in a space without using substantial computing resources (see FIG. 2). Hologram voxels formed at different distances generate a displayed 3D hologram.

The DOE may be configured by various types and technologies, such as a thin grating, a volume grating, a (phase) zone plate which is liquid crystal (LC) based, switchable, optical and/or electronically addressable, or the like.

A hologram forming method may increase the field of view and the resolution of an encoded hologram because the resolution of the DOE mask is greater than the resolution of the SLM. To form a DOE mask, a precomputed and manufactured digital or analog hologram in which the pixel size is several times smaller than the size of the electrically addressable spatial light modulator (EASLM) pixel illuminating the DOE mask is used. For example, the general pixel size of a currently available EASLM (a micro-display, a display) may be 3 μm to 250 μm, and the hologram resolution may be, for example, 0.3 μm (½λ, wherein λ is, for example, 0.6 μm). Accordingly, the resolution of a hologram (DOE mask) may be $(3/0.3)^2=100$ higher.

According to an exemplary embodiment, since the DOE mask has already been computed, the digital hologram processing speed may be increased because there is no need to re-compute the DOE mask each time.

The DOE mask may be precomputed and provide a predetermined characteristic determined by the wavelength and wave surface of reference (read, reconstructed) light, and may be also manufactured to provide a characteristic of an object (hologram) to be reconstructed, for example, an object type (a point, a geometric circle, or the like), a distance to the object, a depth of the object, or the like.

According to an embodiment, the DOE mask may be an amplitude type or a phase type.

According to another embodiment, an addressable LC-based DOE may be used instead of the precomputed and manufactured DOE mask. In this case, in response to a proper control signal with respect to an active layer having a DOE mask, the active layer may or may not exhibit DOE characteristics and may be transparent and weakly scattered.

According to an example embodiment, a holographic display having reduced thickness, increased hologram resolution and field of view may be provided.

According to an example embodiment, an amount of data for hologram formation/processing/storage/transmission may be reduced.

According to an example embodiment, a holographic display using a high-resolution arrangement of masks of a DOE, which is a basic hologram of a basic 3D object having elements of a wavelength size organized into a group that encodes and reconstructs a three-dimensional voxel (3D voxel) of holograms at different distances, may be provided. A basic hologram of a basic 3D object means that a basic 3D object (a voxel, a geometric circle (a circle, a square, or the like) or an icon or other similar 3D objects (including two-dimensional (2D) objects at a specified distance from a screen)) may be encoded by a corresponding hologram, that is, a hologram should be understood as meaning not only a displayed 3D image but also a result of a corresponding encoding and fabrication-a DOE mask.

Figure 3:
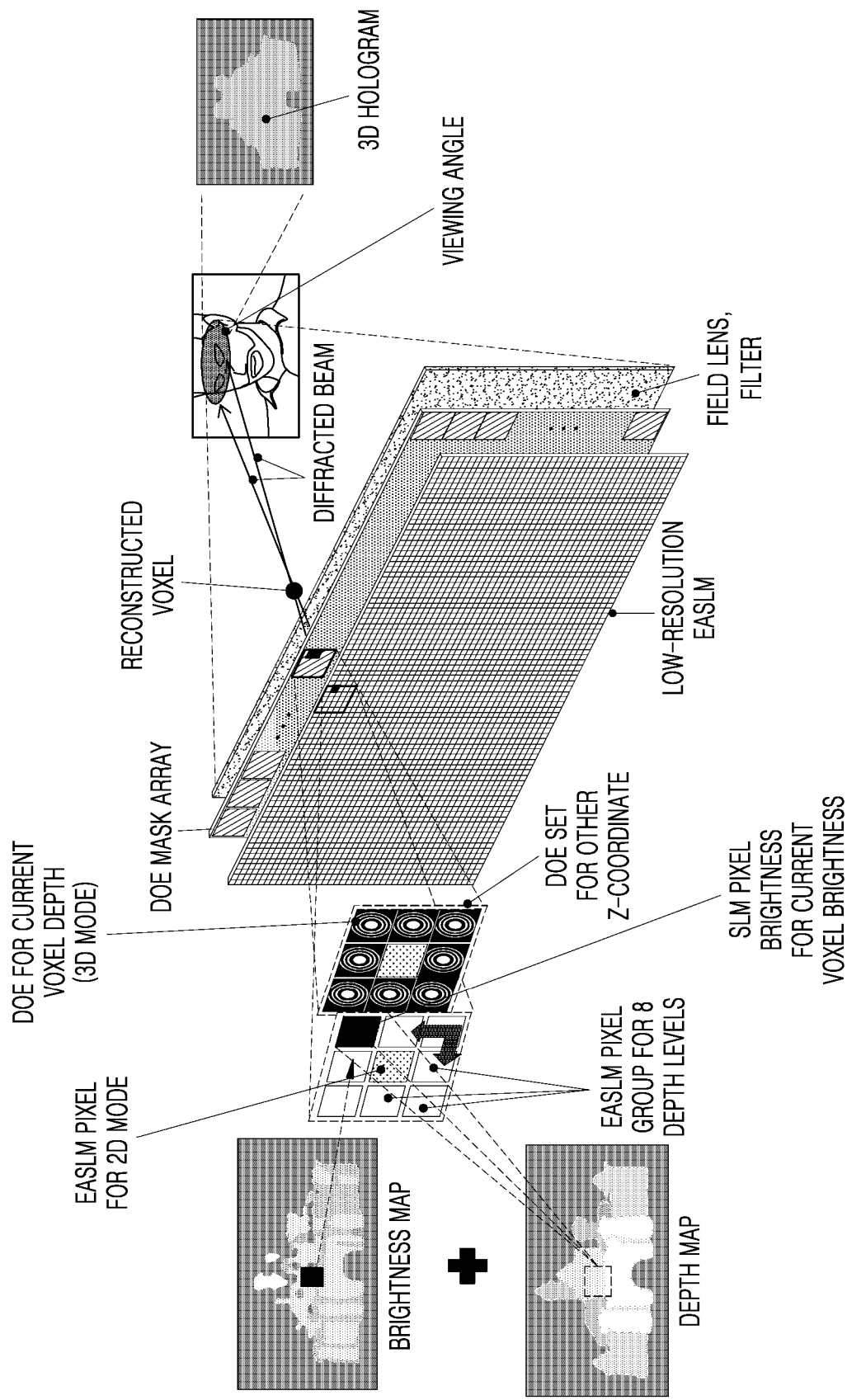
FIG. 3 illustrates an example of the forming of a single-color 3D hologram having eight depth levels.

FIG. 3 illustrates an embodiment of the formation of a single-color 3D hologram having eight depth levels.

Referring to FIG. 3, a hologram forming device (a holographic display) may include a low-resolution SLM, a DOE mask array, and an auxiliary element (a field lens, a filter, or the like). The DOE mask array may include a DOE mask set including eight DOE masks having different characteristics, and each DOE mask may be manufactured in advance and may be manufactured to allow the formation of a voxel at a certain distance corresponding to one of eight depth levels.

In the embodiment shown in FIG. 3 and the following embodiments, the low-resolution SLM is an EASLM (controller-addressable). However, a "static" holographic display having a statically non-addressable SLM (for example, a "holographic picture" of a museum) may be alternatively formed. In addition, a low-resolution static amplitude light modulator or the like illuminated by coherent backlights may be used as the SLM.

To form a hologram, a 2D image brightness map and a 2D depth map may be used as input data. The 2D brightness map represents the brightness of each image pixel characterized by x and y coordinates.

In this embodiment, each pixel of an input 3D image corresponds to eight EASLM pixel sets corresponding to eight depth levels and a pixel (a voxel, for example a light diffuser, as a pixel corresponding to an area in the DOE mask) for an 2D mode operation of a display. Accordingly, in the case of a black-and-white display, the number of EASLM pixels corresponding to the input image pixel should be n+1. Herein, n is the number of depth levels of a holographic display. In a case of a color red, green, and blue (RGB) holographic display, the DOE mask array is static, and when the color RGB holographic display may not be operated in a color sequential mode (where holographic image colors are displayed in sequence), a number of EASLM pixels corresponding to the input 3D image pixel is 3*(n+1).

The above-described input brightness and depth maps may be supplied to an input of a holographic display controller. The controller, based on depth map data, determines which if the eight DOE masks included in each DOE mask set should be illuminated by a low-resolution SLM pixel (EASLM in FIG. 3) to form a desired voxel at a given distance, and the controller, based on the brightness map, specifies the brightness of the low-resolution SLM pixel corresponding to a designated DOE mask to form a desired voxel. Accordingly, a voxel set configuring a holographic image may be formed by turning on the low-resolution SLM pixel having a particular brightness and modulating light with a corresponding DOE mask having different characteristics.

Figure 4A:
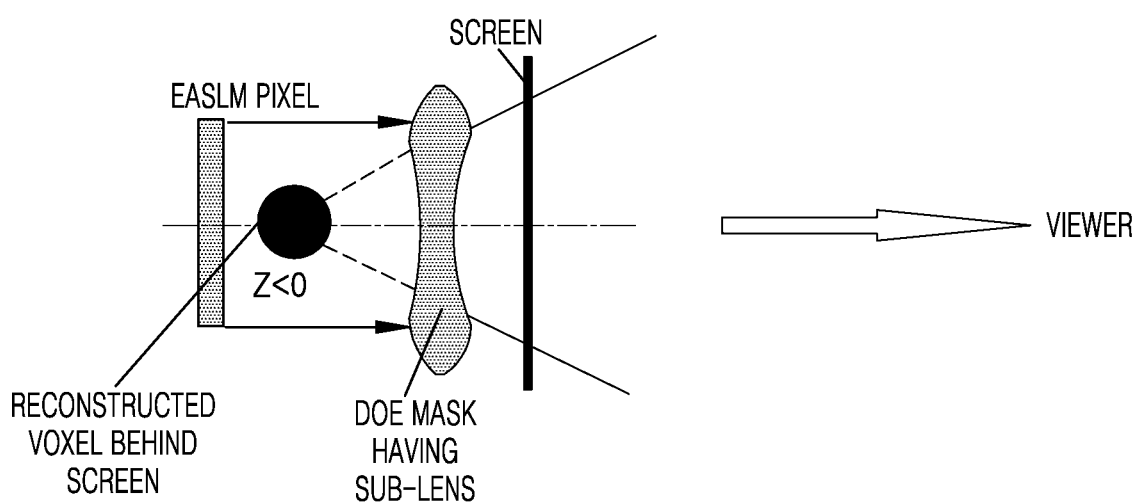
FIGS. 4A and 4B illustrate an operation of a holographic display in a 3D mode, according to an example embodiment.
Figure 4B:
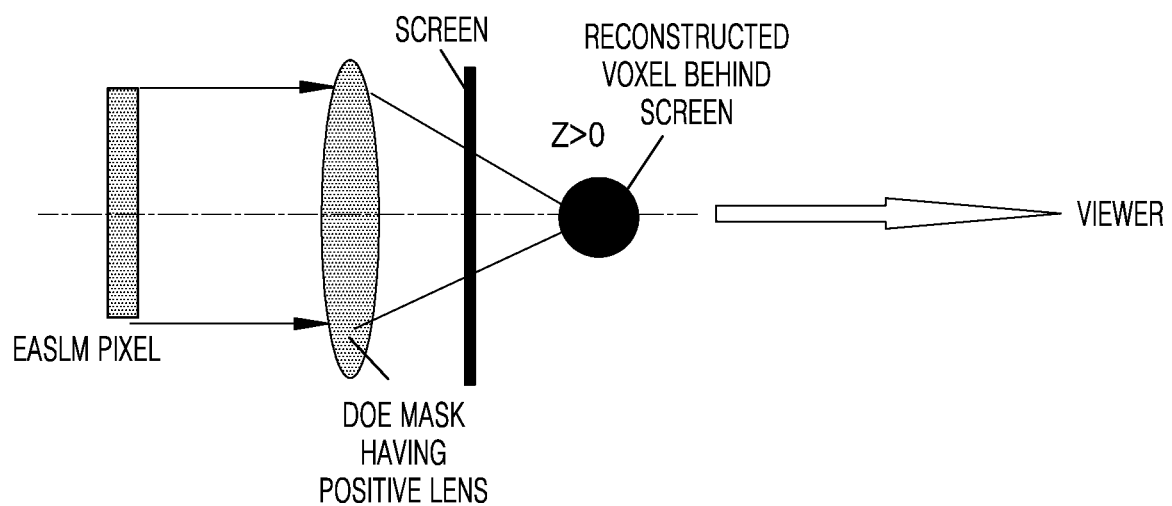
Figure 4C:
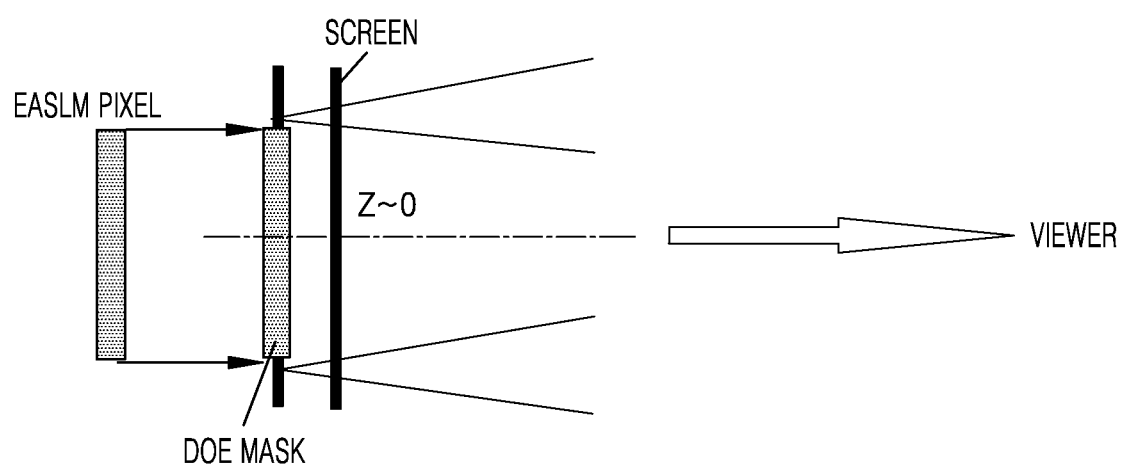
FIG. 4C illustrates an operation of a holographic display in a two-dimensional (2D) mode, according to an example embodiment.

FIGS. 4A and 4B illustrate an operation of a holographic display in a 3D mode, according to an example embodiment. FIG. 4C illustrates an operation of a holographic display in a 2D mode, according to an example embodiment.

In the 3D mode, voxels of a holographic image may be formed behind (FIG. 4A) or in front of (FIG. 4B) a holographic display screen with respect to a viewer. For example, a DOE mask having a sub-(diverging) lens (see FIG. 4A) may be used and a "virtual" hologram voxel is formed behind a screen with respect to a viewer, and in a positive (converging) lens (see FIG. 4B), a "real" hologram voxel may be formed in front of a screen with respect to a viewer. Thus, according to an example embodiment, a hologram giving an impression that an imaged subject is behind or in front of a screen.

At the same time, according to an example embodiment, the holographic display may operate in the 2D mode to form a planar 2D image in a planar mode. To achieve the purpose, a transparent (or diverging) area of the DOE mask, for example, a transparent lens, may be used (no DOE or encoded light diffuser), and light of the EASLM pixel passing through a transparent (or diverging) DOE mask area set may form a planar 2D image for a viewer.

In this case, according to an example embodiment, a holographic display controller may operate the low-resolution SLM and switch between 2D and 3D modes by turning on/off each EASLM pixel and corresponding DOE mask.

Figure 5:
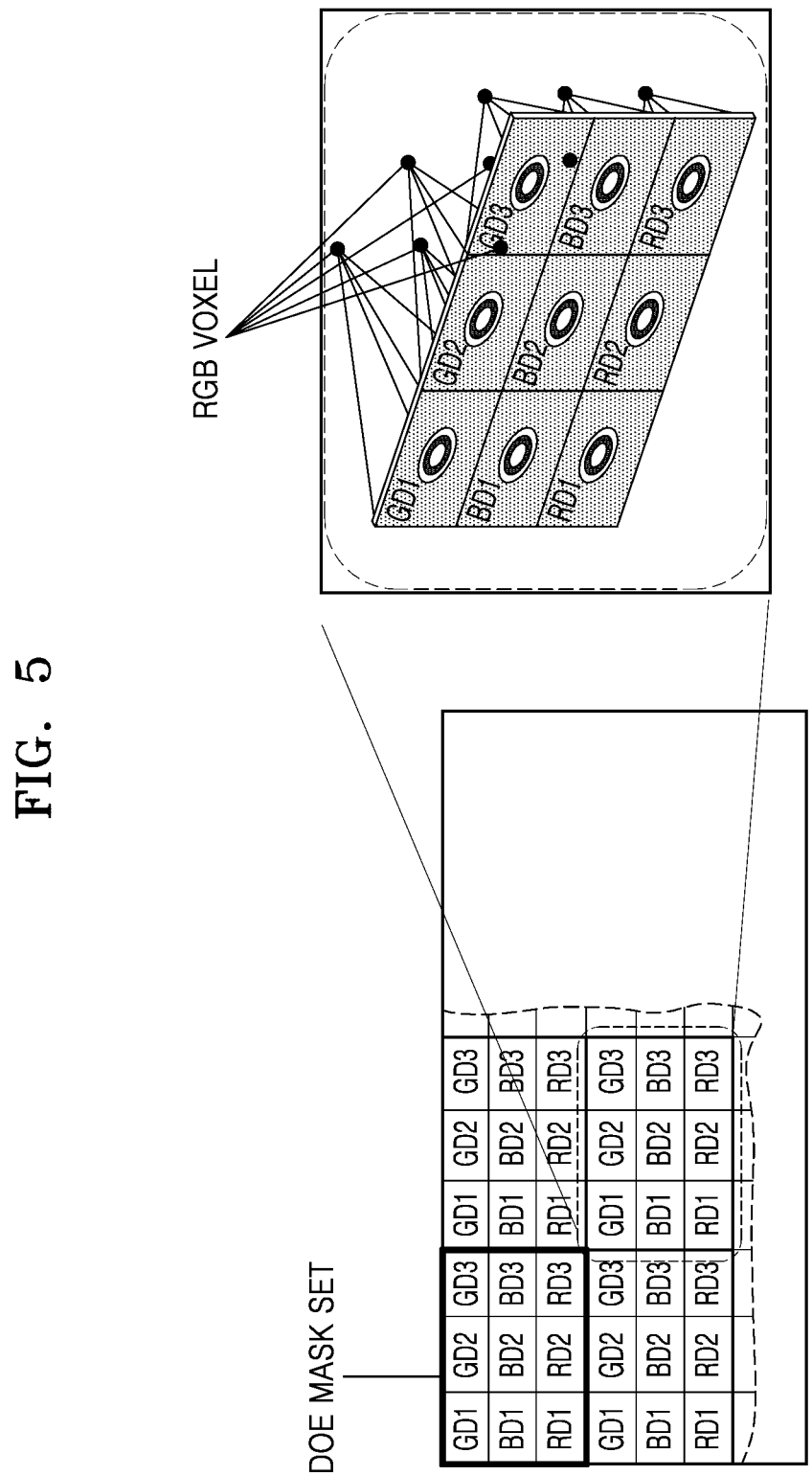
FIG. 5 illustrates an example of an arrangement of a DOE mask configured to form a color hologram image of a holographic display according to an example embodiment.

According an embodiment, the holographic display may form a color 3D holographic image (see FIG. 5).

FIG. 5 illustrates an embodiment of a DOE mask arrangement including a set of DOE masks forming voxels of three different colors and three depth levels. In the embodiment, GD1, GD2, and GD3 elements of one set of DOE masks may be designed to produce green voxels at different depths. BD1, BD2, and BD3 elements of one set of DOE masks may be designed to produce blue voxels at different depths. RD1, RD2, and RD3 elements of one set of DOE masks may be designed to produce red voxels at different depths. The numbers "1, 2, and 3" in the designation of DOE mask elements indicate a depth level. In this case, the resolution of a resulting color holographic image is Nc times lower than that of a single-color image. Herein, Nc is the number of colors of formed voxels.

A joint effect of various elements described above may be used to form voxels of other colors according to a RGB color model by a controller addressing the low-resolution EASLM and the EASLM pixel may be turned on by a corresponding DOE mask having an intensity proportional to R, G, and B intensities in an intensity map of an input 3D image. In addition, the controller may be programmed to operate with other color models (YUW, CMYK, or the like) to perform conversion to the RGB color model.

In a similar method, the DOE mask, EASLM light wavelength and the controller may be configured to operate with a basic color model other than RGB, for example YUW or others.

Figure 6:
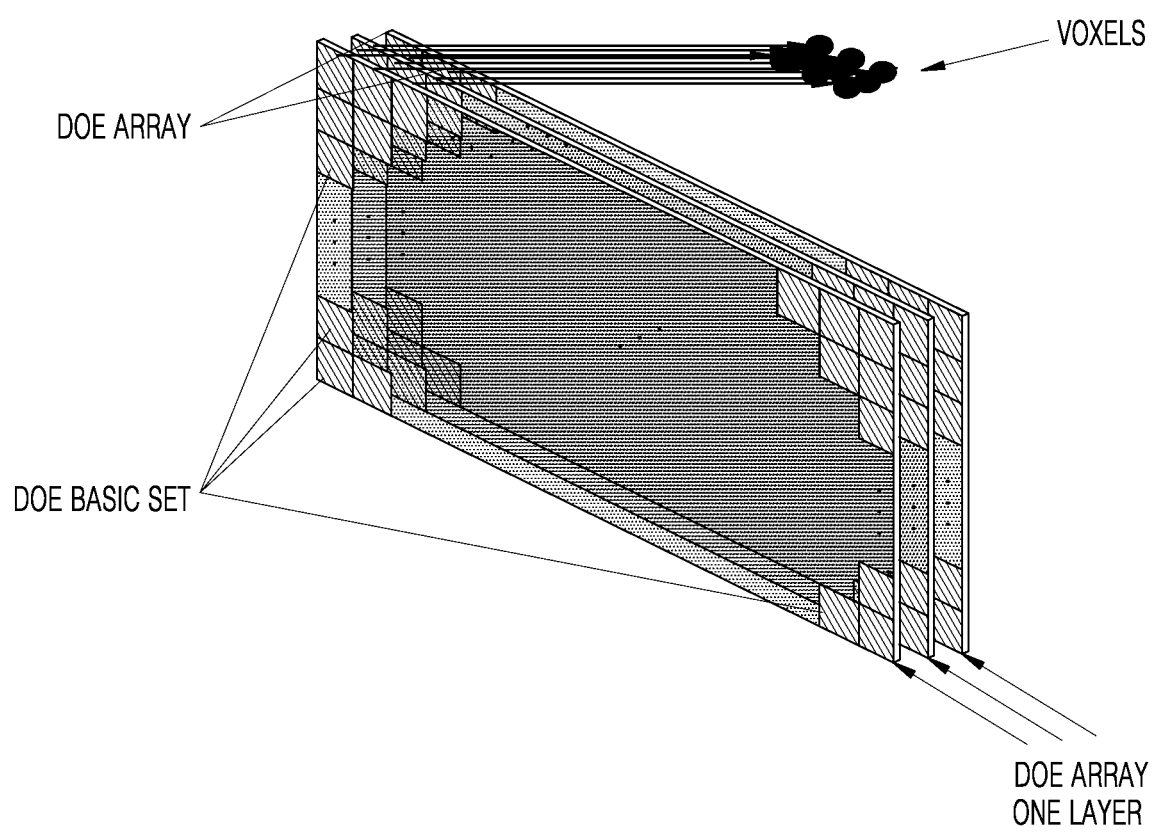
FIG. 6 illustrates an embodiment in which a plurality of controller-operated DOE mask arrays are stacked in multiple layers.

FIG. 6 illustrates an embodiment having a plurality of DOE mask arrays which are stacked in multiple layers, wherein each layer may be addressable (an active layer using LC technology) or static, that is, the DOE mask may have a permanent structure.

To increase the holographic image resolution, the DOE mask arrays may be stacked in layers (see FIG. 6). The display resolution may be increased because the number of voxels formed by modifying EASLM optical characteristics (polarization of light, wavelength, or the like) or activating a corresponding DOE mask layer by an input signal of the controller increases.

At the same time, each DOE mask array stacked in layers may be used to form voxels of one particular color, that is, several layers of the DOE mask array may be used to form a color holographic image while maintaining the resolution of a reproduced image.

In this case, each next layer may be shifted in a horizontal or vertical direction with respect to an adjacent layer by a pitch proportional to the size of one DOE mask and inversely proportional to the number of DOE layers to increase the resolution of a displayed hologram. In addition, each layer may be optically and/or electronically addressed.

Figure 7:
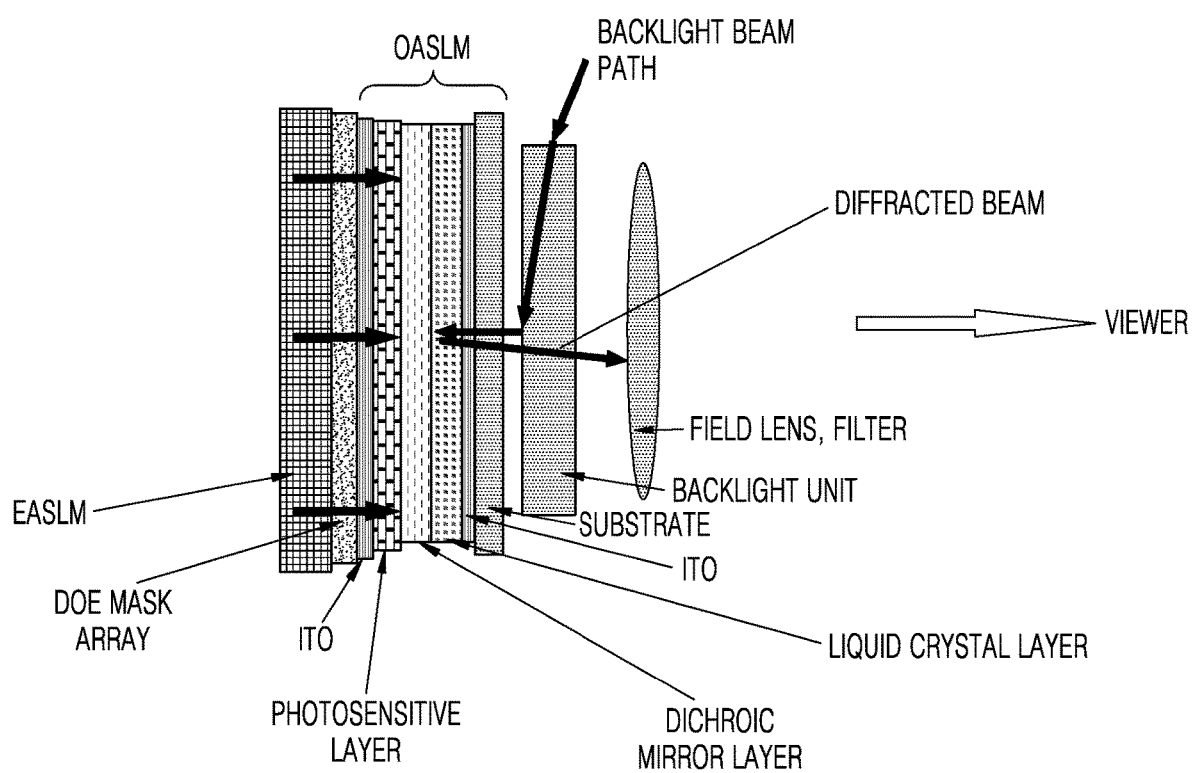
FIG. 7 illustrates an embodiment of an integrated holographic display structure according to an embodiment.

FIG. 7 illustrates an embodiment of an integrated holographic display structure according to an embodiment.

According to an embodiment shown in FIG. 7, the disclosure may find applications of a small holographic display including a non-coherent SLM, a DOE mask array, and an optically-addressable spatial light modulator (OASLM). The holographic display shown in FIG. 7 includes a low-resolution non-coherent EASLM, a DOE amplitude mask array, an OASLM, and a backlight unit. In this embodiment, the OASLM may include several layers arranged in an order, toward the backlight unit, of indium tin oxide (ITO), photosensitive layer, dichroic mirror layer, liquid crystal (LC) layer, ITO, and substrate.

The ITO is a ternary composition of indium, tin, and oxygen in various ratios. In this embodiment, the ITO may be a transparent and thin (nanometer degree) coating evaporated as an electrode.

In response to a controller signal according to data of a displayed 3D image, the low-resolution EASLM may emphasis-mark a DOE array mask set that should construct a voxel set of the displayed hologram (3D image) to an intensity proportional to an intensity level of a 3D point of the displayed 3D image. In this case, light intensity distribution may be formed on the photosensitive layer after the DOE mask array, charge distribution may be caused in the photosensitive layer, and phase modulation in the LC layer of the OASLM may be induced. Next, a phase hologram formed on the LC layer (the controller signal is required to operate the OASLM in a record/read mode) is reconstructed by coherent light of the backlight unit, passes through an angular filter (active or passive) to filter out a harmful diffraction order, passes through a spectral filter (active or passive) to filter EASLM light, and passes through the field lens (optional) to form an eye-observing area of the reconstructed hologram (3D image). The LC layer is a charge distribution controlled phase SLM, which may change orientation of liquid crystal molecules in proportion to a charge in the area due to the charge distribution on the photosensitive layer. The orientation of the liquid crystal molecules determines delay (phase change) of light passing through a LC area. In this method, when diffraction occurs on the phase hologram and a wave surface of a target wave (in this case, corresponding to a set of displayed voxels) is reconstructed, during the reconstruction of the hologram, phase modulation (formation of the phase hologram) and optical phase modulation are made.

In view of the above description, an operation with a general non-coherent display requires the OASLM on the photosensitive layer where the light intensity distribution should be provided after the DOE mask to induce the charge distribution in the photosensitive layer and requires the phase modulation in an OASLM LC layer that represents the phase hologram to be reconstructed by the coherent backlight. Accordingly, when the non-coherent SLM and OASLM are used, the DOE mask should be an amplitude type.

Figure 8:
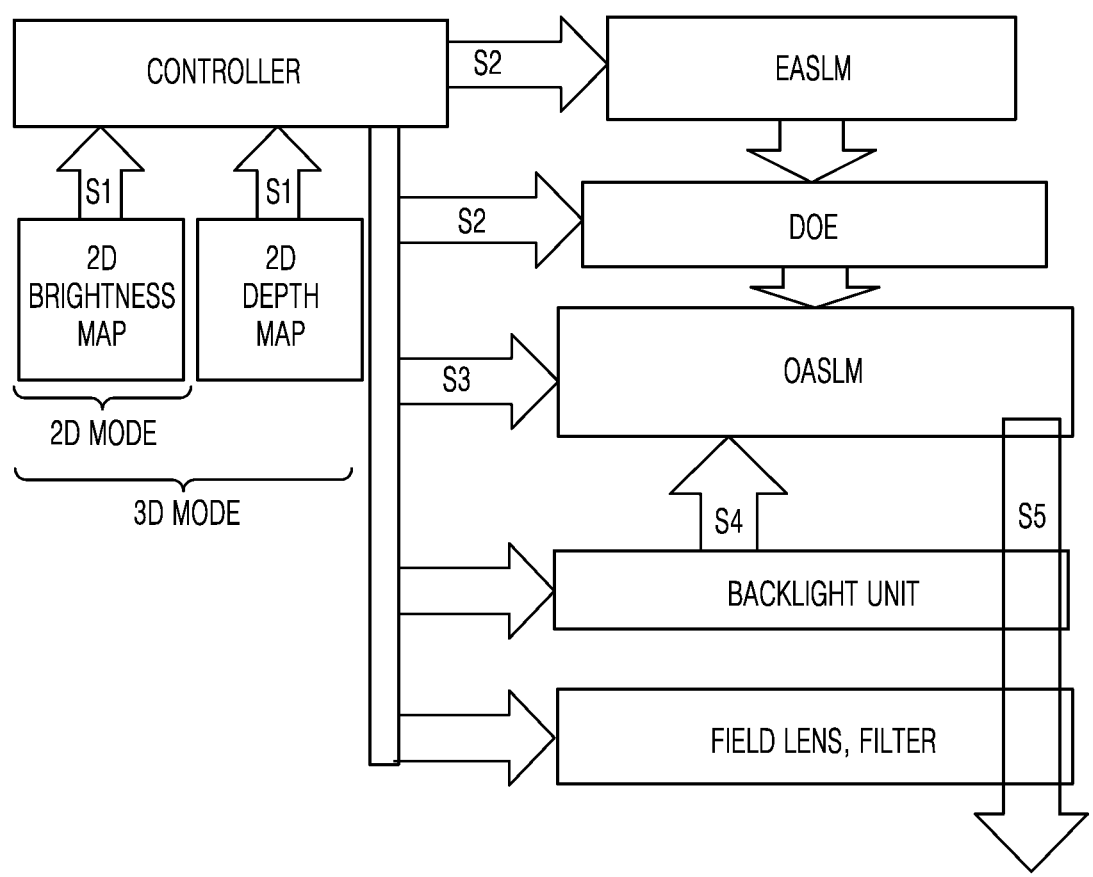
FIG. 8 is a flowchart illustrating an operation algorithm of a holographic display according to the embodiment of FIG. 7.

FIG. 8 is a flowchart illustrating an operation algorithm of the holographic display according to the embodiment shown in FIG. 7.

In operation S1, 2D or 3D image data or precomputed 2D or 3D image data from a 2D/3D camera or other image sources is applied to the holographic display controller. According to an operation mode of the display, the data may be in the following form. The data may be in a form of a 2D brightness map (for 2D mode) or a 2D brightness map and a 2D depth map (for 3D mode).

In operation S2, the controller uses a low-resolution EASLM pixel specifying and corresponding the brightness/intensity of a voxel to generate a control signal with respect to the low-resolution EASLM and a specified high-resolution DOE mask array (when an addressable set of the high-resolution DOE mask array is used to further increase reproduced hologram resolution as shown in FIG. 6) based on 2D brightness map and the 2D depth map data representing the 3D (or 2D) image data such that all voxels are formed. In a 3D mode, at least one high-resolution DOE mask forming at least one voxel of a display hologram may correspond to a single EASLM pixel which is turned on by the controller.

The intensity distribution after the DOE mask array is integrated with the OASLM may be transferred to the OASLM photosensitive layer and cause the charge distribution. At this moment (operation S3), the controller may transmit, to the OASLM, a control signal writing the intensity distribution formed in the photosensitive layer to the phase distribution on the OASLM LC layer, and the charge distribution in the photosensitive layer may cause refractive index modulation in the PASLM LC layer according to a high-resolution hologram pattern of an active DOE mask element illuminated by the low-resolution EASLM.

In operation S4, the backlight unit generates backlight (illumination) for a reflective OASLM, and in operation S5, diffracted light of currently displayed hologram (written in the OASLM) reconstructs the hologram.

A field optical system (a lens or a lenses set) are needed to form a hologram viewing area at a specified distance in the display. A filter may perform spatial/angular/spectral filtering to improve the quality of the displayed 3D hologram and may be passive or active (addressable).

The field optical system, filter (when an active element is used) and the backlight unit also operate in response to the control signal from the controller.

An integrated structure of the non-coherent EASLM, the DOE mask array, and the reflective OASLM may reduce the holographic display size (thickness). Due to the reduced size, the display may be applied to mobile electronic devices such as smart phones, tablets, wearable electronic devices, or the like. Applicability of the non-coherent display and the micro-display in the present disclosure may be used for currently available display: organic light-emitting diode (OLED) display, μ-light-emitting diode (μ-LED) display, liquid crystal display (LCD), or the like.

According to an embodiment, the EASLM used in the holographic display shown in FIG. 7 may be self-luminous (a non-coherent LED/μ-LED, OLED, or the like) or non-self-luminous. When the non-self-luminous ELASM (for example: LCD), an additional non-coherent backlight (a LED, lamp, or the like) should be used.

Figure 9:
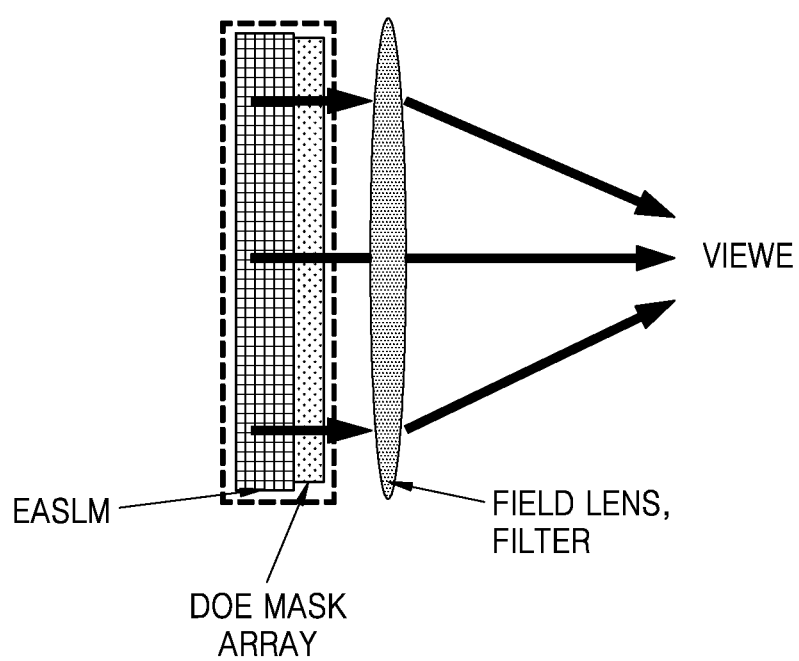
FIG. 9 illustrates another embodiment of a holographic display according to an example embodiment.

In another embodiment (see FIG. 9), a coherent SLM (an EASLM in this embodiment) is used instead of a non-coherent SLM. Accordingly, there is no need to use the reflective OASLM, and the OASLM may be omitted (see FIG. 9) or may be switched to a transmission mode (not shown). The coherent EASLM may be a self-emitting type (for example, a laser diode array) or a non-self-emitting type. In a case of the self-emitting-type EASLM, additional coherent light (for example, a laser array) should be used.

When the coherent SLM is used without the OASLM, the DOE mask may be an amplitude or phase type, and the phase type is more preferred in improving DOE efficiency.

Figure 10:
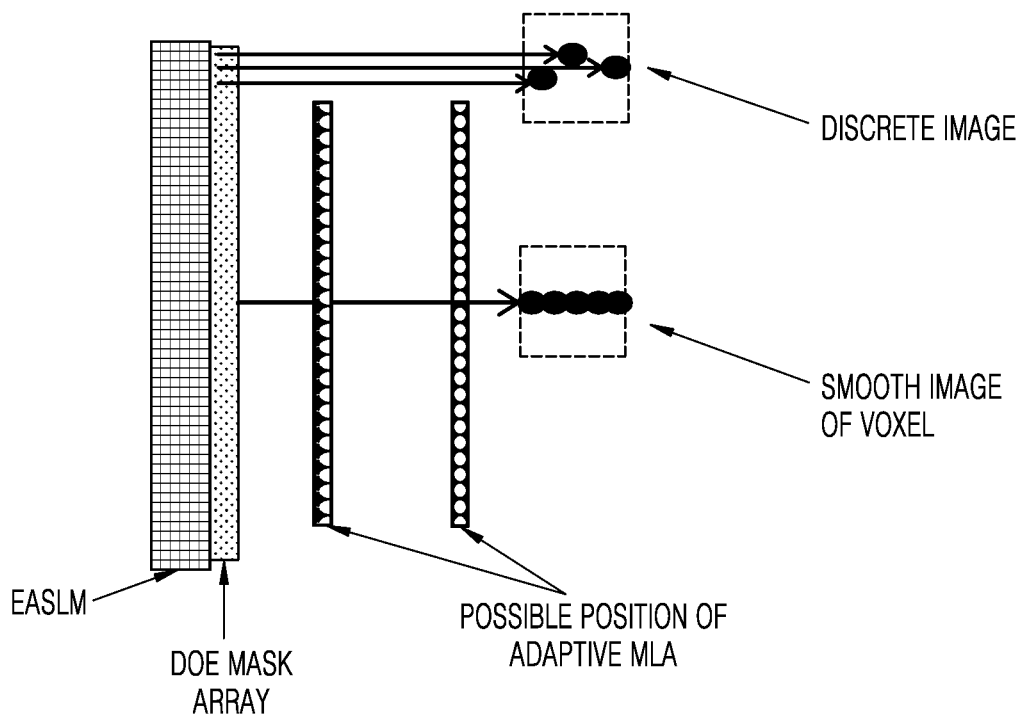
FIG. 10 illustrates another embodiment of a holographic display according to an example embodiment.

In another embodiment of a holographic display shown in FIG. 10, an adaptive multi-lens array (MLA) may be used with an addressable spatial light modulator (ASLM) and the DOE mask array.

In the embodiment, voxels may be formed at a discrete distance zi specified by the DOE mask with respect to each voxel in (x,y) coordinates. The number of possible discrete distances for voxels formation may be determined by the number of DOE masks.

The adaptive (active) MLA according to the embodiment shown in FIG. 10 may change its spatial position with respect to the EASLM and DOE mask array. Accordingly, a (zi) position of the (x,y) voxel may be changed smoothly by changing a focal length of each MLA lens. Thereby, the resolution and depth range of a formed holographic image may be increased. According to the embodiment, the quality and depth of a displayed hologram may be improved.

Thus, according to the disclosure, the resolution of a displayed hologram, a viewing angle of a hologram, and the processing speed of a digital hologram may be increased by using a DOE mask array. The mask array is a pre-developed and manufactured grating set having a key function of a wavelength size, which may increase a diffraction angle and a viewing angle of a displayed hologram, reduce numerical calculations (processor load, storage capacity, data transmission rate), and extend the battery life.

In addition, the holographic display according to the disclosure may have a compact design due to the integrated structure including the non-coherent SLM, the DOE mask array, and the OASLM and may use the non-coherent display and the micro-display (LED, OLED, LCD+LED, or the like). An additional applied lens raster may be used to increase depth resolution of a displayed hologram.

Due to the compact design, the holographic display according to disclosure may find applications displaying information and generating a holographic user interface in mobiles and wearable electronic devices.

Due to a reduced computational load during hologram formation, the present disclosure may extend the battery life of a mobile electronic device including a holographic display and reduce cooling requirements with respect to a processor, a controller, or the like.

The need for only 2D maps as input data for 3D hologram formation may reduce a required data transmission bandwidth.

Although example embodiments have been described in detail and shown in the accompanying drawings, the embodiments are illustrative only and are not intended to limit a broader disclosure, and it should be understood that the present disclosure should not be limited to particular configurations shown and those described herein, as various other modifications may be apparent to those skilled in the art.

Although not particularly mentioned, descriptions with respect to storing data, programs, or the like is obvious to mean that a computer-readable storage medium is available. Examples of the computer readable storage medium includes read-only memory, random access memory, registers, cache memory, semiconductor storage, magnetic media such as internal hard drives and removable disk drives, optical media such as CD-ROM and digital versatile disks (DVD), and any other general storage media.

Features described in various dependent claims and implementation embodiments disclosed in various parts of the disclosure may be combined to achieve beneficial effects even when the ability of the combination is not explicitly disclosed.

The invention claimed is:

1. A holographic display comprising:
    an electrically addressable spatial light modulator (EASLM);
    a diffractive optical element (DOE) mask array arranged on the EASLM; and
    a controller configured to operate the holographic display to form a hologram image,
    wherein the controller is further configured to address the EASLM to backlight a DOE mask of the DOE mask array required to form a hologram image voxel by turning on a corresponding EASLM pixel, and
    wherein the DOE mask array comprises at least one DOE mask having a diverging or converging lens and a DOE mask having a transparent area, and the holographic display is configured to switch between three-dimensional (3D) and two-dimensional (2D) modes by backlighting the at least one divergent or convergent lens of the DOE mask array or the transparent area of the DOE mask array, respectively.

2. The holographic display of claim 1, wherein the EASLM is a non-coherent EASLM.

3. The holographic display of claim 2, further comprising an optically addressable spatial light modulator (OASLM) and a coherent illumination unit,
    wherein the EASLM, the DOE mask array, and the OASLM are integrated into a single unit.

4. The holographic display of claim 3,
    wherein the OASLM comprises a photosensitive layer and a liquid crystal layer, and
    wherein the controller is further configured to operate the OASLM and the coherent illumination unit such that a light intensity distribution formed after the DOE mask array forms a charge distribution in the photosensitive layer of the OASLM and induces phase modulation in the liquid layer of the OASLM to form a phase hologram.

5. The holographic display of claim 4, wherein the coherent illumination unit is configured to form a holographic image by illuminating the phase hologram formed on the liquid crystal layer of the OASLM.

6. The holographic display of claim 1, wherein the EASLM is a coherent EASLM.

7. The holographic display of claim 1, wherein the DOE mask array comprises multiple arrays of DOE masks stacked in a plurality of layers.

8. The holographic display of claim 1, further comprising an adaptive multi-lens array arranged at a distance after the DOE mask array,
    wherein the controller is further configured to operate the adaptive multi-lens array.

9. The holographic display of claim 1, wherein the holographic display is further configured to form a color hologram, wherein a DOE mask arrangement includes a set of DOE masks for forming voxels of different colors.

10. The holographic display of claim 1, further comprising a field optical system capable of spatial light filtering and/or a spectral filter capable of spectral light filtering and an angular filter capable of angular light filtering of the hologram image voxel.

11. The holographic display of claim 1, wherein the DOE mask array is precomputed and manufactured to have a permanent structure and provide a characteristic of the hologram image to be reconstructed.

12. The holographic display of claim 1, wherein the DOE mask array is addressable, and the controller is further configured to address the DOE mask array.

13. A method, performed by the holographic display, of switching between three-dimensional (3D) and two-dimensional (2D) image formation modes according to claim 1, the method comprising:
    receiving holographic image data input by a controller;
    generating by the controller, a control signal to backlight, with an electrically addressable spatial light modulator (EASLM), a diffractive optical element (DOE) mask of a diffractive optical element (DOE) mask array which is to form a holographic image voxels based on the input data in response to the control signal turning on/off a corresponding EASLM pixel; and
    forming an image by the EASLM and the DOE mask array according to a control signal of the controller,
    wherein the 3D and the 2D image formation modes are switched between by the control signal turning off/on an EASLM pixel corresponding to at least one divergent or convergent lens of the DOE mask array and turning on/off an EASLM pixel corresponding to a transparent lens of the DOE mask array, respectively.

* * * * *